(12) United States Patent
Mitsuhashi et al.

(10) Patent No.: US 6,531,045 B2
(45) Date of Patent: Mar. 11, 2003

(54) SURFACE-TREATED COPPER FOIL, METHOD OF PRODUCING THE SURFACE-TREATED COPPER FOIL, AND COPPER-CLAD LAMINATE EMPLOYING THE SURFACE-TREATED COPPER FOIL

(75) Inventors: Masakazu Mitsuhashi, Ageo (JP); Takashi Kataoka, Ageo (JP); Naotomi Takahashi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 09/769,244

(22) Filed: Jan. 26, 2001

(65) Prior Publication Data

US 2001/0014406 A1 Aug. 16, 2001

(30) Foreign Application Priority Data

Jan. 28, 2000 (JP) .......................... 2000-020884

(51) Int. Cl.[7] .............. C25D 5/10; C25D 5/12; C25D 5/14; C25D 25/48; C23C 28/02
(52) U.S. Cl. .............. 205/176; 205/178; 205/180; 205/181; 205/182; 205/184; 205/185; 205/220; 205/224
(58) Field of Search .................. 205/176, 178, 205/180, 181, 182, 184, 185, 220, 224

(56) References Cited

U.S. PATENT DOCUMENTS 5,215,646 A * 6/1993 Wolski et al. ............... 205/77
5,366,814 A * 11/1994 Yamanishi et al. ......... 428/607

FOREIGN PATENT DOCUMENTS

JP 07-231161 A * 8/1995

* cited by examiner

Primary Examiner—Edna Wong
(74) Attorney, Agent, or Firm—Rothwell, Figg, Ernst and Manbeck, P.C.

(57) ABSTRACT

The invention provides a surface-treated copper foil for producing printed wiring boards whose surface has been subjected to nodular treatment and anti-corrosion treatments, wherein the anti-corrosion treatment includes forming a zinc-copper-nickel ternary alloy anti-corrosive plating layer on a surface of the copper foil; forming an electrolytic chromate layer on the anti-corrosive plating layer; forming a silane-coupling-agent-absorbed layer on the electrolytic chromate layer; and drying the copper foil for 2–6 seconds such that the copper foil reaches 105° C.–200° C.

15 Claims, 3 Drawing Sheets

(a)

(b)

(a)

(b)

SURFACE-TREATED COPPER FOIL, METHOD OF PRODUCING THE SURFACE-TREATED COPPER FOIL, AND COPPER-CLAD LAMINATE EMPLOYING THE SURFACE-TREATED COPPER FOIL

TECHNICAL FIELD

The present invention relates to a surface-treated copper foil which has been subjected to anti-corrosion treatment; to a method of producing the surface-treated copper foil; and to a copper-clad laminate employing the surface-treated copper foil.

BACKGROUND ART

Conventionally, surface-treated copper foil has been employed as a material for producing printed wiring boards, which are widely used in the electric and electronics industries. In general, surface-treated copper foil is bonded, through hot-pressing, onto an electrically insulating polymer material substrate such as a glass-epoxy substrate, a phenolic polymer substrate, or polyimide, to thereby form a copper-clad laminate, and the thus-prepared laminate is used for producing printed wiring boards.

Particularly, copper foil in which a zinc-copper-nickel ternary alloy plating layer, serving as an anti-corrosion layer, is formed on a surface of the foil has been widely employed and exhibits excellent heat resistance characteristics (generally called UL heat resistance) and resistance to chemicals (particularly to hydrochloric acid) during the manufacture of printed wiring boards. Among these characteristics, the resistance to hydrochloric acid can be evaluated through the following procedure. In practice, a printed wiring board having a pattern obtained from copper foil is immersed for a predetermined time in a hydrochloric acid solution of predetermined concentration. Instead of measuring the amount of the hydrochloric acid solution which has soaked into an interface between the copper foil pattern and the substrate of the wiring board, the peel strength before immersion and after immersion are measured. The percent loss in peel strength with respect to the initial peel strength is calculated, and the value is employed as an index of resistance to hydrochloric acid.

In general, as the line width of a copper pattern in a printed wiring board decreases, the copper foil for producing a printed wiring board requires higher resistance to hydrochloric acid. When the copper foil shows a large loss in peel strength with respect to the initial peel strength, the interface between the copper foil pattern and the substrate is readily penetrated by a hydrochloric acid solution and the interface readily undergoes corrosion. In a printed wiring board produced from such copper foil, the copper circuit pattern is likely to drop out of the substrate, since the copper foil is treated with a variety of acidic solutions during fabrication of printed wiring boards.

In recent years, the thickness, weight, and dimensions of electronic and electric apparatus have been steadily decreasing, and therefore, there is corresponding demand for further reduction in the width of the copper pattern line to be formed on printed wiring boards. In this connection, there is additional demand for copper foil having higher resistance to hydrochloric acid to be used in the production of printed wiring boards.

Some references; e.g., Japanese Patent Application Laid-Open (kokai) Nos. Hei 04-318997 and Hei 07-321458, disclose copper foil employing an anti-corrosive layer formed of a zinc-copper-nickel ternary alloy plating layer and a chromate layer in combination and excellent resistance thereof to hydrochloric acid. At the time of filing the aforementioned patent applications, resistance to hydrochloric acid was generally evaluated by measurement on a copper pattern specimen having a line width of 1 mm. The specification of the latter publication discloses that the test is carried out by measurement on a copper pattern specimen having a line width of 1 mm and obtained from the copper foils. Actually, the present inventors have produced the copper foils, on a trial basis, by means of the methods disclosed in the above-mentioned publications, and have performed a test for evaluating resistance to hydrochloric acid by use of copper pattern specimens having a line width of 1 mm and obtained from the copper foils. Results similar to those disclosed in those publications have been attained. Some references; i.e., kokai patent publications specified below, disclose methods for enhancing resistance of copper foil to hydrochloric acid, including subjecting a surface to be bonded to a substrate to treatment with a silane coupling agent.

However, through formation of a copper pattern having a line width of 0.2 mm with copper foil prepared for test purposes according to the methods disclosed in the above kokai patent publications and testing for evaluation of resistance to hydrochloric acid, the inventors have found that most specimens exhibited a percent loss in resistance against hydrochloric acid degradation of 15% or more. Concerning current tests to evaluate resistance of copper foil against hydrochloric acid, it has been accepted that product quality which meets the recent trend toward reduction of the line width of copper patterns cannot be guaranteed unless evaluation tests are performed for copper pattern specimens having a line width of approximately 0.2 mm. For example, even though copper foil attains a percent loss in resistance against hydrochloric acid of approximately 3.0% as measured on a copper pattern prepared from the copper foil and having a line width of 1 mm, the same copper foil attains a percent loss in hydrochloric acid degradation of more than 10% as measured on a copper pattern prepared from the copper foil and having a line width of 0.2 mm. In some cases, the percent loss reaches 20% or more. Therefore, the quality of copper foil for producing fine-pitch copper patterns cannot be evaluated through a conventional test method including measurement on a copper pattern having a line width of 1 mm.

In a copper-clad laminate, the silane coupling agent is present between an anti-corrosion layer formed on metallic copper foil and a substrate formed of any of a variety of organic materials. However, details of the silane coupling agent; e.g., the method of employment thereof, have not been studied thoroughly. Heretofore, there have been filed several patent applications with regard to copper foil employing a silane coupling agent.

For example, Japanese Patent Publication (kokoku) Nos. Sho 60-15654 and Hei 02-19994 disclose copper foil in which a zinc or zinc alloy layer is formed on a surface of the foil, a chromate layer is formed on the zinc or zinc alloy layer, and a silane coupling agent layer is formed on the chromate layer. Judging from comprehensive consideration of the aforementioned patent publications, these patents focus on drying treatment performed after formation of a chromate layer, and treatment with a silane coupling agent performed after drying. However, the present inventors have found that copper foil of expected performance cannot be obtained unless a specific factor is controlled; i.e., performance and quality of copper foil, particularly resistance to hydrochloric acid and moisture, vary greatly between lots even when the copper foil is produced, on a trial basis, by means of the disclosed methods.

Japanese Patent Publication (kokoku) No. Hei 02-17950 discloses that treatment of copper foil with a silane coupling agent is able to improve resistance to hydrochloric acid, but does not specifically disclose the moisture resistance of copper foil. In recent years, there have arisen problems which correspond to trends toward formation of miniature-wiring and multilayer printed wiring boards and in the field of packaging of semiconductor devices. Due to the employment of a copper-clad laminate having poor moisture resistance, delamination of multilayer printed wiring boards and deterioration of pressure-cooker performance of packaged semiconductor devices have occurred.

As described above, regarding formation of a silane coupling agent layer on an anti-corrosion layer comprising a zinc or zinc alloy layer on copper foil and a chromate layer formed on the zinc or zinc alloy layer, it is considered that no attained invention takes into consideration combination of the silane coupling agent and the anti-corrosion layer, surface conditions of the anti-corrosion layer during adsorption of the silane coupling agent, and drying conditions, and brings out the maximum effect in the employed silane coupling agent.

BRIEF DESCRIPTION OF THE DRAWINGS

Each of FIGS. 1(a) and 1(b) is a schematic cross-sectional view of surface-treated copper foil.

SUMMARY OF THE INVENTION

The present inventors have attempted to provide surface-treated copper foil capable of consistently attaining a percent loss in resistance against hydrochloric acid of 10% or less as measured on a copper pattern prepared from the copper foil and having a line width of 0.2 mm, by bringing out the maximum effect of the silane coupling agent employed in copper foil coated with an anti-corrosive layer formed of a zinc-copper-nickel ternary alloy. Also, the inventors have attempted to impart excellent moisture resistance to the surface-treated copper foil. Thus, the inventors have conducted extensive studies, and have found three important factors—i.e., the conditions of the anti-corrosion layer before the copper foil is treated with a coupling agent, which is the most important factor; the timing of treatment with the silane coupling agent; and drying conditions after coupling treatment—that must be addressed in order to bring out the maximum effect of the employed silane coupling agent. The present invention has been accomplished on the basis of these findings.

In a first embodiment of the present invention, there is provided a surface-treated copper foil for producing printed wiring boards whose surface has been subjected to nodular treatment and anti-corrosion treatment, wherein the anti-corrosion treatment comprises forming a zinc-copper-nickel ternary alloy plating layer on a surface of the copper foil; forming an electrolytic chromate layer on the zinc-copper-nickel ternary alloy plating layer; forming a silane-coupling-agent-adsorbed layer on the electrolytic chromate layer; and drying the copper foil for 2–6 seconds such that the copper foil reaches 105° C.–200° C.

In a second embodiment of the present invention, there is provided a surface-treated copper foil for producing printed wiring boards whose surface has been subjected to nodular treatment and anti-corrosion treatment, wherein the nodular treatment comprises depositing copper microparticles on a surface of the copper foil; seal plating so as to prevent dropping of the copper microparticles; and further depositing copper ultra-microparticles; and the anti-corrosion treatment comprises forming a zinc-copper-nickel ternary alloy plating layer on a surface of the copper foil; forming an electrolytic chromate layer on the zinc-copper-nickel ternary alloy plating layer; forming a silane-coupling-agent-adsorbed layer on the electrolytic chromate layer; and drying the copper foil for 2–6 seconds such that the copper foil reaches 105° C.–200° C.

Figure 1:
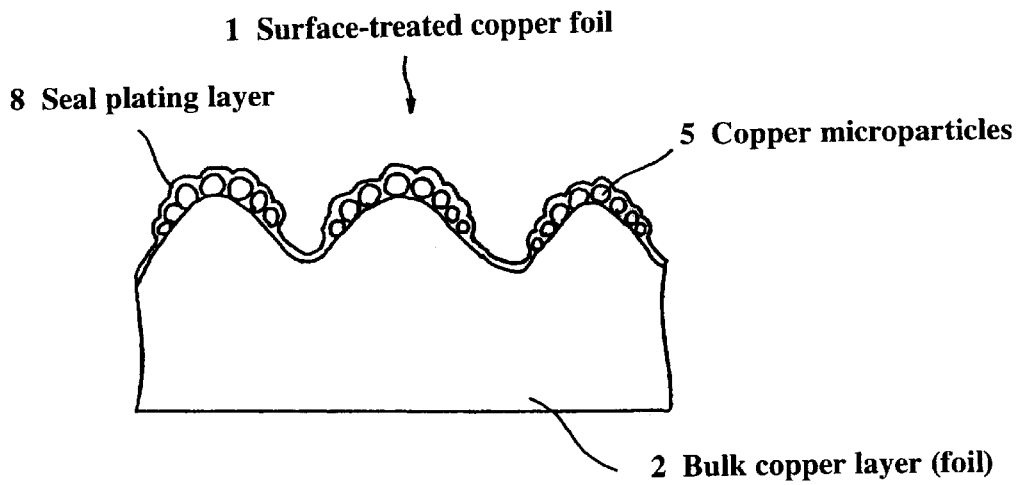
Figure 1:
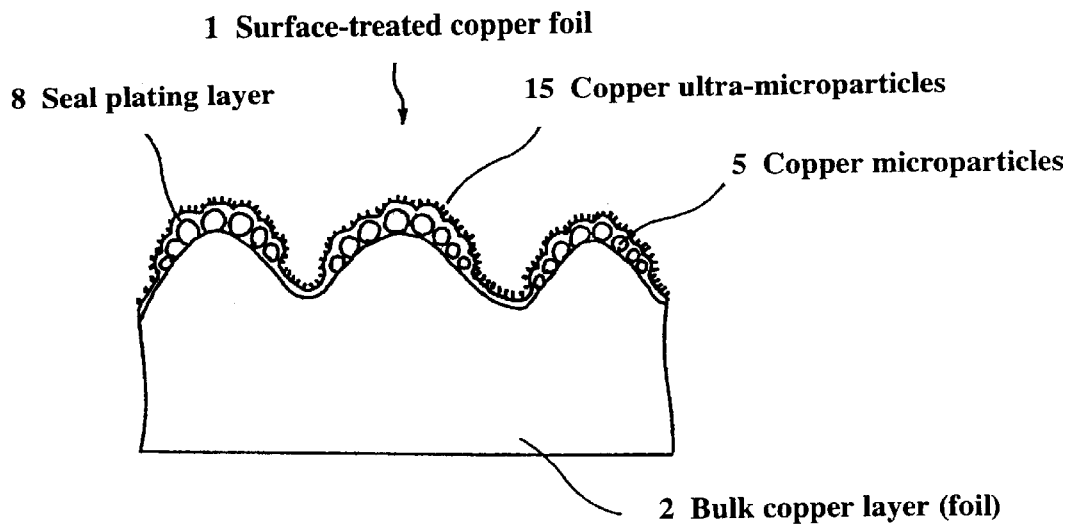

As shown in FIG. 1, the difference between the surface-treated copper foil in the first embodiment and that of the second embodiment resides in the form of copper microcrystals, which provide an anchor effect during bonding to a substrate. Specifically, FIG. 1(a) is a schematic cross-sectional view of a surface-treated copper foil as seen in the first embodiment. As shown in FIG. 1(a), on a copper foil surface, copper microparticles are formed under conditions for forming burnt deposits, and seal plating is performed so as to prevent dropping of the copper microparticles. During the seal plating, copper is deposited under level plating conditions. As shown in FIG. 1(b)—a schematic cross-sectional view of a surface-treated copper foil as seen in the second embodiment—the structure is characterized in that copper ultra-microparticles (persons skilled in the art may call the particles "whisker plating") are deposited on the seal plating layer of the surface-treated copper foil as seen in the first embodiment. Typically, the copper ultra-microparticles are formed by use of an arsenic-containing copper plating bath. In FIGS. 1(a) and 1(b), an anti-corrosion layer and a silane-coupling-agent-adsorbed layer are not illustrated.

The surface-treated copper foil as seen in the second embodiment, in which copper ultra-microparticles are formed during a nodular treatment step, is endowed with surface micro-roughness provided by the microparticles, thereby enhancing adhesion to an organic material substrate. Thus, the foil assures adhesion to a substrate higher than that of the surface-treated copper foil as seen in the first embodiment.

Preferably, the surface-treated copper foil as seen in the first embodiment is produced through a first or second method. In the first method, there is provided a method of producing a surface-treated copper foil for producing printed wiring boards, which method includes a surface-treating method comprising forming a nodular-treated surface on a copper foil; subjecting the copper foil to anti-corrosion treatment; effecting adsorption of a silane coupling agent S onto the nodular-treated surface; and drying, wherein the anti-corrosion treatment comprises performing zinc-copper-nickel ternary alloy plating on a surface of the copper foil; subsequently performing electrolytic chromate treatment; drying a surface of the copper foil after electrolytic chromate treatment; effecting adsorption of a silane coupling agent; and drying the copper foil for 2–6 seconds in a high-temperature atmosphere such that the copper foil reaches 105° C.–180° C.

In the second method, there is provided a method of producing a surface-treated copper foil for producing printed wiring boards, which method includes a surface-treating method comprising forming a nodular-treated surface on a copper foil; subjecting the copper foil to anti-corrosion treatment; effecting adsorption of a silane coupling agent onto the nodular-treated surface; and drying, wherein the anti-corrosion treatment comprises performing zinc-copper-nickel ternary alloy plating on a surface of the copper foil; subsequently performing electrolytic chromate treatment; effecting adsorption of a silane coupling agent without causing the electrolytically chromate-treated surface to attain dryness; and drying the copper foil for 2–6 seconds in a high-temperature atmosphere such that the copper foil reaches 110° C.–200° C.

The difference between the first and second methods of producing a surface-treated copper foil resides in the timing for effecting adsorption of silane coupling agent; i.e., effecting the adsorption treatment after drying of the electrolytically chromate-treated surface of the copper foil is completed or effecting the adsorption treatment without causing the electrolytically chromate-treated surface to attain dryness. The difference will be described hereafter with reference to experimental data. Actually, surface-treated copper foil obtained through the latter method; i.e., "a method of producing a surface-treated copper foil including effecting the adsorption treatment without causing the electrolytically chromate-treated surface to attain dryness," has better quality in terms of resistance to hydrochloric acid.

Preferably, the surface-treated copper foil of the second embodiment is produced through a third or a fourth method. In the third method, there is provided a method of producing a surface-treated copper foil, which method includes a surface-treating method comprising forming a nodular-treated surface on a copper foil; subjecting the copper foil to anti-corrosion treatment; effecting adsorption of a silane coupling agent onto the nodular-treated surface; and drying, wherein the nodular treatment comprises depositing copper microparticles on a surface of the copper foil; seal plating so as to prevent dropping of the copper microparticles; and further depositing copper ultra-microparticles; and the anti-corrosion treatment comprises performing zinc-copper-nickel ternary alloy plating on a surface of the copper foil; subsequently performing electrolytic chromate treatment; drying a surface of the copper foil after electrolytic chromate treatment; effecting adsorption of a silane coupling agent; and drying the copper foil for 2–6 seconds in a high-temperature atmosphere such that the copper foil reaches 105° C.–180° C.

In the fourth method, there is provided a method of producing a surface-treated copper foil, which method includes a surface-treating method comprising forming a nodular-treated surface on a copper foil; subjecting the copper foil to anti-corrosion treatment; effecting adsorption of a silane coupling agent onto the nodular-treated surface; and drying, wherein the nodular treatment comprises depositing copper microparticles on a surface of the copper foil; seal plating so as to prevent dropping of the copper microparticles; and further depositing copper ultra-microparticles; and the anti-corrosion treatment comprises performing zinc-copper-nickel ternary alloy plating on a surface of the copper foil; subsequently performing electrolytic chromate treatment; effecting adsorption of a silane coupling agent without causing the electrolytically chromate-treated surface to attain dryness; and drying the copper foil for 2–6 seconds in a high-temperature atmosphere such that the copper foil reaches 110° C.–200° C.

Similar to the difference between the first and second methods, the difference between the third and fourth methods of producing a surface-treated copper foil resides in the timing of effecting adsorption of the silane coupling agent; i.e., effecting the adsorption treatment after drying of the electrolytically chromate-treated surface of the copper foil is completed or effecting the adsorption treatment without causing the electrolytically chromate-treated surface to attain dryness. However, the first and second methods differ from the third and fourth methods in terms of their respective nodular treatment steps. Specifically, the first and second methods, nodular treatment comprises depositing copper microparticles on a surface of the copper foil and seal plating so as to prevent dropping of the copper microparticles, whereas in the third and fourth methods, nodular treatment further comprises depositing copper ultra-microparticles after completion of the seal plating. The difference will be described hereafter with reference to experimental data. Actually, surface-treated copper foil obtained through the latter method; i.e., "a method of producing a surface-treated copper foil including effecting the adsorption treatment without causing the electrolytically chromate-treated surface to attain dryness," has better quality in terms of resistance to hydrochloric acid.

The surface-treated copper foil according to the present invention will next be described with reference to the first through the fourth methods of production; i.e., the method of producing a surface-treated copper foil. Unless otherwise specified, the conditions for each production step are fixed. The surface-treated copper foil according to the present invention is produced through the following steps: feeding an electrolyte containing a copper component into a space defined by a rotating drum cathode and a lead anode which faces the cathode so as to surround the rotating cathode, to thereby effect electrolysis; peeling the resultant thin copper film from the rotatable cathode, to thereby obtain a copper layer (foil); and subjecting the thus-obtained copper foil to surface treatment including nodular treatment, anti-corrosion treatment, and treatment with a silane coupling agent. The copper layer may alternatively be produced from a copper ingot through rolling; i.e., may be rolled copper foil. Throughout the description, the term "copper layer (foil)" may be referred to as simply "copper foil," or, in some cases, may be used as is for the sake of clarity.

Next, the surface-treatment steps will be described in sequence. The surface-treated copper foil of the present invention is produced through surface treatment of copper foil by means of an apparatus generally called a surface-treating apparatus. In practice, copper foil is unwound from one direction and transferred into a surface-treatment apparatus in which rinsing baths are appropriately disposed. In the apparatus, the copper foil travels through a pickling bath; a nodular treatment bath in which copper microparticles are formed on a surface of the copper foil; a ternary-alloy-anti-corrosion bath; an electrolytic-chromate treatment-anti-corrosion bath; and a drying section, which are disposed serially, thereby forming a surface-treated copper foil product.

Figure 2:
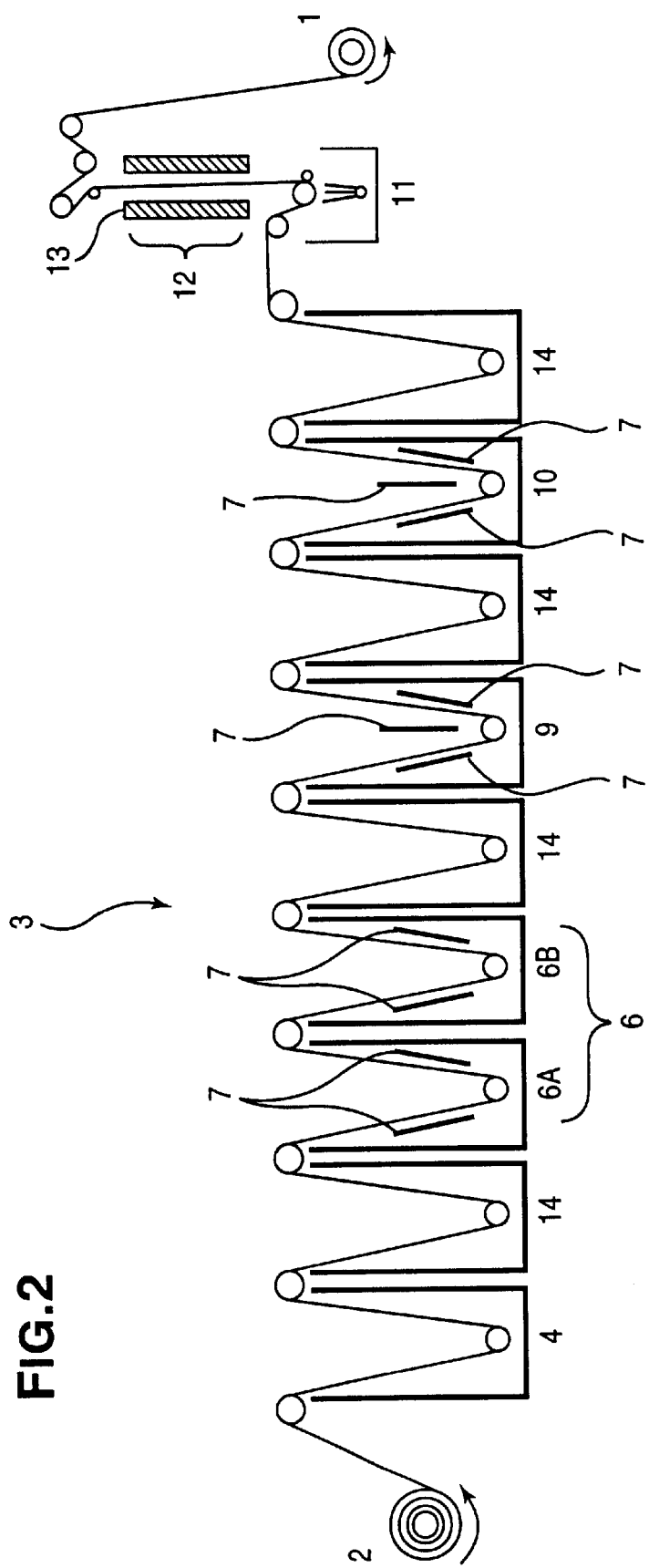
FIGS. 2 and 3 are general schematic cross-sectional views showing a surface-treating apparatus for producing the surface-treated copper foil.

As shown in FIG. 2—a schematic cross-sectional view of a surface-treating apparatus—unwound copper foil travels in a winding manner along the process line (baths and steps) in the apparatus. Alternatively, the surface-treatment may be carried out in a batch manner; i.e., the process line may be segmented.

In a pickling bath, pickling is carried out in order to completely remove oily matter and surface oxide film from copper foil. The copper foil is passed through the pickling bath so as to clean the surfaces and assure uniform electrodeposition carried out in a subsequent step. No particular limitation is imposed on the pickling solution, and a variety of solutions, such as hydrochloric acid solution, sulfuric acid solution, and sulfuric acid-hydrogen peroxide solution, can be employed. The concentration and temperature of the pickling solution may be determined in accordance with characteristics of the production line.

After pickling of the copper foil is completed, the copper foil is transferred into a rinsing bath. Subsequently, the rinsed copper foil is transferred into a bath for forming copper microparticles on a surface of the copper foil. No particular limitation is imposed on the electrolyte containing a copper component and employed in the above bath. However, electrolysis is carried out under conditions for forming burnt deposits so as to deposit copper microparticles. Thus, the concentration of the electrolyte employed in the above bath for depositing copper microparticles is adjusted to be lower than that of the solution employed in the production of copper foil, so as to readily attain burnt deposition conditions. The conditions for forming burnt deposits are not particularly limited, and are determined in consideration of characteristics of the production line. For example, when a copper sulfate solution is employed, the conditions are as follows: concentration of copper (5–20 g/l), concentration of free sulfuric acid (50–200 g/l), optionally required additives (a-naphthoquinoline, dextrin, glue, thiourea, etc.), solution temperature (15–40° C.), and current density (10–50 A/dm$^2$).

Seal plating is carried out in order to prevent release of the deposited copper microparticles. The seal plating step involves the uniform deposition of copper such that the copper microparticles are covered with copper under level-plating conditions in order to prevent release of the deposited copper microparticles. Thus, the copper electrolyte employed for performing seal plating has a higher concentration than does a copper electrolyte employed for depositing copper microparticles. The seal plating conditions are not particularly limited, and are determined in consideration of characteristics of the production line. For example, when a copper sulfate solution is employed, the conditions are as follows: concentration of copper (50–80 g/l), concentration of free sulfuric acid (50–150 g/l), solution temperature (40–50° C.), and current density (10–50 A/dm$^2$).

In the method according to third or fourth methods for producing a surface-treated copper foil as recited in the second embodiment, copper ultra-microparticles are typically formed by employing an electrolyte containing a copper component and arsenic. For example, when a copper sulfate solution is employed, the conditions are as follows: concentration of copper (10 g/l), concentration of free sulfuric acid (100 g/l), concentration of arsenic (1.5 g/l), solution temperature (38° C.), and current density (30 A/dm$^2$).

In recent years, however, environmental issues have become of great concern, and therefore, employment of elements which are hazardous to the human body are being eliminated to the utmost. In the present invention, the aforementioned arsenic may be employed in order to form copper ultra-microparticles. However, in a fifth method of production, a copper-component-containing electrolyte to which 9-phenylacridine, instead of arsenic, is added is preferably employed in the present invention. During electrolysis for depositing copper, 9-phenylacridine plays a role similar to that of arsenic. Briefly, 9-phenylacridine enables both regulation of the size of the copper microparticles deposited and uniform deposition thereof. In order to form copper ultra-microparticles, the aforementioned electrolyte contains copper (5–10 g/l), free sulfuric acid (100–120 g/l), and 9-phenylacridine (50–300 mg/l). When electrolysis is carried out by use of the electrolyte at 30–40° C. and a current density of 20–40 A/dm$^2$, stable electrolysis can be performed.

In the subsequent anti-corrosion bath, treatment to prevent oxidation-induced corrosion of a copper foil surface is carried out in accordance with purposes of use thereof such that, for example, the copper foil is not affected during production of copper-clad laminates and printed wiring boards. In the present invention, anti-corrosion treatment is carried out through the combination of plating of a zinc-copper-nickel ternary alloy and electrolytic chromate plating.

When plating of a zinc-copper-nickel ternary alloy is carried out, a plating bath such as a pyrophosphate plating bath can be employed, since the solution of the bath is chemically stable during long-term storage and exhibit excellent stability to electric current. For example, when a pyrophosphate plating bath is employed, plating conditions are as follows: zinc concentration (2–20 g/l), copper concentration (1–15 g/l), nickel concentration (0.5–5 g/l), potassium pyrophosphate concentration (70–350 g/l), solution temperature (30–60° C.), pH (9–10), current density (3–8 A/dm$^2$), and electrolysis time (5–15 seconds).

In a third embodiment, the zinc-copper-nickel ternary alloy plating preferably has a composition of 66.9–20 wt. % zinc, 30–70 wt. % copper, and 0.1–10 wt. % nickel. When a silane coupling agent is brought into adsorption on the zinc-copper-nickel ternary alloy plating having such a composition and the copper foil is dried under the below-mentioned conditions, resistance to hydrochloric acid is most effectively attained. This is why the composition is preferred. In addition, the zinc-copper-nickel ternary alloy plating falling within the compositional range can be performed on a copper foil surface very reliably. Thus, this compositional range is also suitable from the aspect of product yield.

After plating of the zinc-copper-nickel ternary alloy is completed, the plated copper foil is rinsed. Subsequently, a chromate layer is formed on a surface of the rinsed copper foil through electrolysis. Although no particular limitation is imposed on the electrolysis conditions, preferred conditions are as follows: concentration of chromic acid (3–7 g/l), solution temperature (30–40° C.), pH (10–12), current density (5–8 A/dm$^2$), and electrolysis time (5–15 seconds). When chromate treatment is carried out under the above conditions, a surface of the plated copper foil is covered uniformly.

In the first method of producing a surface-treated copper foil, the silane-coupling-agent-adsorption treatment is effected after completion of drying the electrolytically chromate-treated surface of the copper foil. In this case, a drying step is added to the rinsing step after completion of electrolytic chromate treatment in the procedure carried out in a surface-treating apparatus. In contrast, in the second method of producing a surface-treated copper foil, the adsorption treatment is effected without causing the electrolytically chromate-treated and rinsed surface to attain dryness, immediately after completion of formation of the electrolytic chromate layer.

In this case, no particular limitation is imposed on the method for forming the silane coupling agent layer, and methods such as immersion, showering, and spraying may be adopted. Any method may be employed in accordance with production steps, so long as the method can bring the copper foil into contact with a solution containing the silane coupling agent in the most uniform state.

In a fourth embodiment, any silane coupling agent selected from among olefin-group-functional silanes, epoxy-group-introduced silanes, acrylic-group-functional silanes, amino-group-introduced silanes, and mercapto-group-functional silanes can be employed. When these silane coupling agents are employed on a copper foil surface to be bonded to a substrate, it is important that these silane coupling agents exhibit no effect on a subsequent etching step and the performance of produced printed wiring boards.

More specifically, silane coupling agents employed for glass cloth contained in a prepreg for producing printed wiring boards may alternatively be used. Examples of such coupling agents include vinyltrimethoxysilane, vinylphenyltrimethoxysilane, γ-methacryloxypropyltrimethoxysilane, γ-glycidoxypropyltrimethoxysilane, 4-glycidylbutyltrimethoxysilane, γ-aminopropyltriethoxysilane, N-β-(aminoethyl)-γ-aminopropyltrimethoxysilane, N-3-(4-(3-aminopropoxy)butoxy)propyl-3-aminopropyltrimethoxysilane, imidazolylsilane, triazinylsilane, and γ-mercaptopropyltrimethoxysilane.

These silane coupling agents are dissolved in water serving as a solvent so as to attain a concentration of 0.3–15 g/l, and the prepared solutions are employed at room temperature. The silane coupling agent is coupled through condensation with OH groups contained in the anti-corrosion layer of the copper foil, to thereby form a coating layer. Thus, a coupling agent solution of excessively high concentration cannot attain coupling effect commensurate with an increase in concentration, and the concentration should be determined in accordance with treatment conditions, such as treatment rate. However, when the concentration is less than 0.3 g/l, adsorption of the silane coupling agent is slow, thereby failing to attain a typical level of commercial profitability and failing to attain uniform adsorption. In contrast, even when the concentration is in excess of 15 g/l, adsorption speed does not particularly increase and resistance to hydrochloric acid is not particularly enhanced. Such an adsorption rate is economically disadvantageous.

Finally, the drying step is carried out. This step is performed not only to remove water, but also to accelerate condensation reaction between the adsorbed coupling agent and OH groups contained in the surface of the anti-corrosion layer, to thereby completely evaporate water generated during condensation reaction. The drying step should not be carried out at a temperature that causes breakage or decomposition of a functional group of the silane coupling agent that forms a bond with a resin constituting a substrate during bonding with the substrate, because when there occurs breakage or decomposition of the functional group of the silane coupling agent that forms a bond with a resin constituting a substrate, adhesion between copper foil and the substrate becomes poor, to thereby fail to bring out a maximum effect of the adsorbed silane coupling agent.

Particularly, copper foil; i.e., metallic material, exhibits rapid thermal conduction as compared with glassy material or organic material such as plastic to which a silane coupling agent is typically applied. Thus, the silane coupling agent adsorbed on the copper foil is very susceptible to heat; i.e., high temperature during drying and heat radiated from a heat source. Accordingly, when drying is carried out by means of hot air; i.e., the temperature of the copper foil is elevated very rapidly by hot air supplied from the blower, drying conditions must be determined very carefully. Conventionally, drying has been carried out in consideration of only the temperature of the atmosphere or that of the air blow in a drying furnace. However, in the present invention, since controlling of the temperature of foil per se is focused on, drying is preferably performed by passing foil through a heating furnace for 2–6 seconds. Thus, the drying method is not particularly limited, and drying may be performed using an electric heater or through air blowing. The point is that the temperature of the foil per se must be controlled within a predetermined range. In the present invention, the drying time and the drying temperature are set to fall within certain ranges. This is because that the temperature elevation rate of copper foil varies due to slight differences in the speed at which the surface-treated copper foil is produced or unevenness in the thickness of the copper foil. Thus, actual operational conditions are determined within the above ranges in accordance with the types of products to be made.

Among drying conditions, the drying temperature after completion of electrolytic chromate treatment is modified to suit a specific silane-coupling-agent treatment; i.e., treatment carried out after the copper foil has been dried and treatment carried out without causing the copper foil to attain dryness. The reason for the modification is that the above two types of silane-coupling treatment differ in the temperature range in which functional groups contained in the silane coupling agent layer formed on the nodular-treated side of the substrate and which are bonded to the substrate remain intact, thereby attaining sufficient fixation of the coupling agent to the copper foil surface.

In the first or third methods, including drying copper foil; treating the dried foil with a silane coupling agent; and further drying the treated foil, a considerable amount of heat supplied to the high-temperature atmosphere is consumed in condensation reaction of the silane coupling agent on the chromate-treated layer during the drying. In contrast, in the second or fourth methods, surface-treated copper foil is produced by sequentially forming an electrolytic chromate layer, rinsing with water, and forming a silane coupling agent layer without drying the surface to which the coupling agent is applied, and subsequently drying. Thus, a greater amount of water remains in the copper foil during drying as compared with the case of surface-treated copper foil produced by sequentially forming an electrolytic chromate layer, drying, forming a silane coupling agent layer, and drying again. During heating to dry, a considerable amount of heat is consumed for evaporating water. Thus, it is assumed that even though the drying atmosphere temperature is raised to approximately 200° C., heat sufficient for breaking or decomposing functional groups of the silane coupling agent is difficult to generate. Thus, breakage of the functional groups which are contained in the silane coupling agent layer and which are bonded to the substrate is more effectively prevented, thereby improving the quality of surface-treated copper foil products.

In order to confirm the assumption, copper foils according to the first or second embodiment of the present invention having a thickness of 35 μm were produced by drying at various temperatures for four seconds, and each of the produced copper foils was laminated with FR-4 to produce a copper-clad laminate. An electric circuit having a line width of 0.2 mm was formed from the copper-clad laminate, and peel strength was measured for each laminate. The results of evaluation are shown are shown in Tables 1 to 4.

TABLE 1

| | Peel test results (0.2 mm-line-width circuit) | | | |
|---|---|---|---|---|
| Foil temperature at drying | Initial peel strength kg/cm | Peel strength after floating on solder bath kg/cm | Resistance to HCl; loss in peel strength (%) | Moisture resistance; loss in peel strength (%) |
| 80 | 1.88 | 1.87 | 37.5 | 21.3 |
| 100 | 1.89 | 1.87 | 30.8 | 17.2 |
| 105 | 1.88 | 1.86 | 8.3 | 9.9 |
| 110 | 1.87 | 1.85 | 7.6 | 9.4 |
| 120 | 1.86 | 1.85 | 8.1 | 8.7 |
| 130 | 1.87 | 1.86 | 7.4 | 8.6 |
| 140 | 1.88 | 1.87 | 7.2 | 7.5 |
| 150 | 1.89 | 1.88 | 7.5 | 8.2 |

TABLE 1-continued

Peel test results (0.2 mm-line-width circuit)

| Foil temperature at drying | Initial peel strength kg/cm | Peel strength after floating on solder bath kg/cm | Resistance to HCl; loss in peel strength (%) | Moisture resistance; loss in peel strength (%) |
|---|---|---|---|---|
| 160 | 1.87 | 1.85 | 8.0 | 8.0 |
| 170 | 1.88 | 1.86 | 7.3 | 7.7 |
| 180 | 1.86 | 1.85 | 6.9 | 8.2 |
| 190 | 1.88 | 1.87 | 11.1 | 10.6 |
| 200 | 1.88 | 1.86 | 12.4 | 10.8 |
| 210 | 1.87 | 1.86 | 17.2 | 14.3 |
| 220 | 1.86 | 1.86 | 22.3 | 21.6 |

Copper foil employed: Surface-treated copper foil produced from the first embodiment through the first method (no copper ultra-microparticles were formed, and silane-coupling-agent treatment was carried out after drying).

Initial peel strength: A copper-clad laminate was prepared from FR-4, and a copper pattern having a line width of 0.2 mm was formed on FR-4. The peel strength between the copper line and the substrate was measured.

Peel strength after floating on solder bath: The copper-patterned board was floated on a solder bath (246° C.) for 20 seconds, and then cooled to room temperature. The peel strength was then measured.

Resistance to to HCl (loss in peel strength (%)): A copper-clad laminate was prepared from FR-4, and a copper pattern having a line width of 0.2 mm was formed on FR-4. The thus-prepared board was immersed in a solution of hydrochloric acid and water (1:1) for one hour at room temperature, and then removed from the solution, washed with water, and dried. Immediately after the board was dried, the peel strength was measured. The percent loss in peel strength with respect to the initial peel strength was calculated.

Moisture resistance (loss in peel strength (%)): A copper-clad laminate was prepared from FR-4, and a copper pattern having a line width of 0.2 mm was formed on FR-4. The thus-prepared board was immersed in boiling deionized water (pure water) for two hours, and then pulled from the water and dried. Immediately after the board was dried, the peel strength was measured. The percent loss in peel strength with respect to the initial peel strength was calculated.

TABLE 2

Peel test results (0.2 mm-line-width circuit)

| Foil temperature at drying | Initial peel strength kg/cm | Peel strength after floating on solder bath kg/cm | Resistance to HCl; loss in peel strength (%) | Moisture resistance; loss in peel strength (%) |
|---|---|---|---|---|
| 80 | 1.87 | 1.85 | 30.7 | 25.8 |
| 100 | 1.87 | 1.86 | 31.2 | 25.2 |
| 105 | 1.88 | 1.86 | 18.5 | 21.2 |
| 110 | 1.88 | 1.87 | 6.6 | 8.5 |
| 120 | 1.87 | 1.87 | 5.5 | 8.3 |

TABLE 2-continued

Peel test results (0.2 mm-line-width circuit)

| Foil temperature at drying | Initial peel strength kg/cm | Peel strength after floating on solder bath kg/cm | Resistance to HCl; loss in peel strength (%) | Moisture resistance; loss in peel strength (%) |
|---|---|---|---|---|
| 130 | 1.86 | 1.84 | 5.0 | 8.0 |
| 140 | 1.89 | 1.88 | 4.7 | 7.9 |
| 150 | 1.88 | 1.87 | 4.8 | 6.9 |
| 160 | 1.88 | 1.86 | 5.1 | 7.4 |
| 170 | 1.87 | 1.86 | 4.7 | 7.5 |
| 180 | 1.86 | 1.84 | 4.0 | 6.3 |
| 190 | 1.86 | 1.85 | 3.0 | 7.1 |
| 200 | 1.88 | 1.89 | 4.2 | 7.0 |
| 210 | 1.87 | 1.86 | 11.5 | 21.8 |
| 220 | 1.88 | 1.86 | 21.4 | 30.3 |

Copper foil employed: Surface-treated copper foil produced from the first embodiment through the second method (no copper ultra-microparticles were formed, and silane-coupling-agent treatment was carried out without causing the copper foil to attain dryness).

Initial peel strength: A copper-clad laminate was prepared from FR-4, and a copper pattern having a line width of 0.2 mm was formed on FR-4. The peel strength between the copper line and the substrate was measured.

Peel strength after floating on solder bath: The copper-patterned board was floated on a solder bath (246° C.) for 20 seconds, and then cooled to room temperature. The peel strength was then measured.

Resistance to HCl (loss in peel strength (%)): A copper-clad laminate was prepared from FR-4, and a copper pattern having a line width of 0.2 mm was formed on FR-4. The thus-prepared board was immersed in a solution of hydrochloric acid and water (1:1) for one hour at room temperature, and then removed from the solution, washed with water, and dried. Immediately after the board was dried, the peel strength was measured. The percent loss in peel strength with respect to the initial peel strength was calculated.

Moisture resistance (loss in peel strength (%)): A copper-clad laminate was prepared from FR-4, and a copper pattern having a line width of 0.2 mm was formed on FR-4. The thus-prepared board was immersed in boiling deionized water (pure water) for two hours, and then pulled from the water and dried. Immediately after the board was dried, the peel strength was measured. The percent loss in peel strength with respect to the initial peel strength was calculated.

TABLE 3

Peel test results (0.2 mm-line-width circuit)

| Foil temperature at drying | Initial peel strength kg/cm | Peel strength after floating on solder bath kg/cm | Resistance to HCl; loss in peel strength (%) | Moisture resistance; loss in peel strength (%) |
|---|---|---|---|---|
| 80 | 1.88 | 1.87 | 30.0 | 27.0 |
| 100 | 1.88 | 1.88 | 22.6 | 14.3 |
| 105 | 1.88 | 1.87 | 8.7 | 7.5 |

TABLE 3-continued

Peel test results (0.2 mm-line-width circuit)

| Foil temperature at drying | Initial peel strength kg/cm | Peel strength after floating on solder bath kg/cm | Resistance to HCl; loss in peel strength (%) | Moisture resistance; loss in peel strength (%) |
|---|---|---|---|---|
| 110 | 1.88 | 1.87 | 6.8 | 7.4 |
| 120 | 1.87 | 1.85 | 7.2 | 6.7 |
| 130 | 1.89 | 1.87 | 7.4 | 7.3 |
| 140 | 1.88 | 1.88 | 6.9 | 7.3 |
| 150 | 1.87 | 1.88 | 6.0 | 7.2 |
| 160 | 1.88 | 1.87 | 6.6 | 6.8 |
| 170 | 1.87 | 1.86 | 7.0 | 6.4 |
| 180 | 1.88 | 1.87 | 6.3 | 6.1 |
| 190 | 1.89 | 1.87 | 10.5 | 18.6 |
| 200 | 1.87 | 1.88 | 12.7 | 21.8 |
| 210 | 1.88 | 1.87 | 16.8 | 24.7 |
| 220 | 1.87 | 1.86 | 23.3 | 28.7 |

Copper foil employed: Surface-treated copper foil produced from the second embodiment through the third method (copper ultra-microparticles were formed, and silane-coupling-agent treatment was carried out after drying).

Initial peel strength: A copper-clad laminate was prepared from FR-4, and a copper pattern having a line width of 0.2 mm was formed on FR-4. The peel strength between the copper line and the substrate was measured.

Peel strength after floating on solder bath: The copper-patterned board was floated on a solder bath (246° C.) for 20 seconds, and then cooled to room temperature. The peel strength was then measured.

Resistance to HCl (loss in peel strength (%)): A copper-clad laminate was prepared from FR-4, and a copper pattern having a line width of 0.2 mm was formed on PR-4. The thus-prepared board was immersed in a solution of hydrochloric acid and water (1:1) for one hour at room temperature, and then removed from the solution, washed with water, and dried. Immediately after the board was dried, the peel strength was measured. The percent loss in peel strength with respect to the initial peel strength was calculated.

Moisture resistance (loss in peel strength (%)): A copper-clad laminate was prepared from FR-4, and a copper pattern having a line width of 0.2 mm was formed on FR-4. The thus-prepared board was immersed in boiling deionized water (pure water) for two hours, and then pulled from the water and dried. Immediately after the board was dried, the peel strength was measured. The percent loss in peel strength with respect to the initial peel strength was calculated.

TABLE 4

Peel test results (0.2 mm-line-width circuit)

| Foil temperature at drying | Initial peel strength kg/cm | Peel strength after floating on solder bath kg/cm | Resistance to HCl; loss in peel strength (%) | Moisture resistance; loss in peel strength (%) |
|---|---|---|---|---|
| 80 | 1.89 | 1.87 | 39.7 | 26.3 |
| 100 | 1.88 | 1.87 | 28.6 | 25.3 |
| 105 | 1.89 | 1.88 | 19.2 | 21.5 |
| 110 | 1.89 | 1.88 | 2.6 | 6.8 |
| 120 | 1.88 | 1.87 | 1.7 | 5.4 |
| 130 | 1.87 | 1.87 | 1.7 | 5.2 |
| 140 | 1.89 | 1.88 | 1.2 | 6.0 |
| 150 | 1.88 | 1.86 | 1.3 | 5.9 |
| 160 | 1.87 | 1.86 | 0.0 | 5.5 |
| 170 | 1.88 | 1.87 | 1.0 | 6.3 |
| 180 | 1.87 | 1.87 | 0.0 | 5.0 |
| 190 | 1.89 | 1.87 | 0.8 | 4.1 |
| 200 | 1.89 | 1.88 | 1.4 | 4.7 |
| 210 | 1.88 | 1.87 | 14.7 | 19.8 |
| 220 | 1.87 | 1.86 | 22.1 | 24.6 |

Copper foil employed: Surface-treated copper foil produced from the second embodiment through the fourth method (copper ultra-microparticles were formed, and silane-coupling-agent treatment was carried out without causing the copper foil to attain dryness).

Initial peel strength: A copper-clad laminate was prepared from FR-4, and a copper pattern having a line width of 0.2 mm was formed on FR-4. The peel strength between the copper line and the substrate was measured.

Peel strength after floating on solder bath: The copper-patterned board was floated on a solder bath (246° C.) for 20 seconds, and then cooled to room temperature. The peel strength was then measured.

Resistance to HCl (loss in peel strength (%)): A copper-clad laminate was prepared from FR-4, and a copper pattern having a line width of 0.2 mm was formed on FR-4. The thus-prepared board was immersed in a solution of hydrochloric acid and water (1:1) for one hour at room temperature, and then removed from the solution, washed with water, and dried. Immediately after the board was dried, the peel strength was measured. The percent loss in peel strength with respect to the initial peel strength was calculated.

Moisture resistance (loss in peel strength (%)): A copper-clad laminate was prepared from FR-4, and a copper pattern having a line width of 0.2 mm was formed on FR-4. The thus-prepared board was immersed in boiling deionized water (pure water) for two hours, and then pulled from the water and dried. Immediately after the board was dried, the peel strength was measured. The percent loss in peel strength with respect to the initial peel strength was calculated.

As is clear from Tables 1 to 4, in no specimen is significant difference observed between initial peel strength and peel strength after floating on a solder bath. However, resistance to hydrochloric acid and moisture resistance are deteriorated critically at certain temperatures, and an appropriate drying temperature zone is found. The surface-treated copper foil specimens which were produced by drying at a temperature falling within the temperature zone exhibit such excellent and constant resistance to hydrochloric acid (loss in peel strength (%)) and moisture resistance (loss in peel strength (%)) that have never been attained. Resistance to hydrochloric acid (loss in peel strength (%)) is an index for showing the loss in peel strength caused by treatment with hydrochloric acid as shown in each Table with respect to the initial peel strength of the copper foil—measurement of the initial peel strength was performed immediately after the test pattern was formed from the copper foil—and was calculated from the following formula:

[Resistance to hydrochloric acid (loss in peel strength (%))]=([initial peel strength]−[peel strength after immersing HCl solution])/[initial peel strength]. Moisture resistance (loss in peel strength (%)) is an index for showing the loss in peel strength caused by moisture-absorption treatment as described in each Table with respect to the initial peel strength of the copper foil—measurement of the initial peel strength was performed immediately after the test pattern was formed from the copper foil—and was calculated from the following formula:

[Moisture resistance (loss in peel strength (%))]=([initial peel strength]−[peel strength after boiling])/[initial peel strength]. Accordingly, the smaller these percent loss s in peel strength, the better the quality of the surface-treated copper foil.

In addition, comparison between Tables 1 and 2 and between Tables 3 and 4 reveals that the surface-treated copper foil which was produced by treating electrolytically chromate-treated copper foil with a silane coupling agent without causing the copper foil to attain dryness has better resistance to hydrochloric acid and moisture resistance than do the surface-treated copper foils produced by drying the electrolytically chromate-treated copper foil and subsequently treating the foil with a silane coupling agent.

Comparison between Tables 1 and 2 and between Tables 3 and 4 further reveals that when the copper foil was produced by drying copper foil and subsequently treating the foil with a silane coupling agent, the appropriate temperature of the foil per se at drying (in the Tables, the temperature is referred to as foil temperature) falls within the range of 105° C. to 180° C. where resistance to hydrochloric acid and moisture resistance are excellent, whereas when the copper foil was produced by treating copper foil with a silane coupling agent without causing the copper foil to attain dryness, the appropriate temperature of the foil per se falls within the range of 110° C. to 200° C. where resistance to hydrochloric acid and moisture resistance are found to be excellent. In the latter case, the foil temperature can be adjusted to a slightly higher temperature than the foil temperature of the former case. Thus, it is considered that when the foil temperature is lower than either lower limit, the silane coupling agent is insufficiently fixed onto the copper foil, resulting in poor adhesion to a substrate. It is also considered that when the foil temperature is in excess of either upper limit, the functional groups of the silane coupling agent that are to be bonded with the substrate are broken or decomposed, causing poor adhesion to a substrate to thereby lower resistance to hydrochloric acid and moisture resistance (elevating decrease ratios in peel strength).

Furthermore, comparison between Tables 1 and 3 and between Tables 2 and 4 further reveals that the copper foil produced by forming copper ultra-microparticles after seal plating in nodular treatment possesses higher resistance to hydrochloric acid and higher moisture resistance. It is considered that the anchor effect provided by a nodular surface of the surface-treated copper foil increases, thereby enhancing adhesion to a substrate.

As described hereinabove, surface-treated copper foil according to the present invention was produced. Copper-clad laminates fabricated from the copper foil produced in the aforementioned manner exhibit excellent and constant resistance to hydrochloric acid and moisture resistance. Thus, the first embodiment of a copper-clad laminate employing a surface-treated copper foil described in any of the first through fourth embodiments has considerably improved quality and provides high reliability during an etching process.

In the present specification, the term "copper-clad laminate" encompasses a single-sided substrate, a double-sided substrate, and a multilayer substrate. Such substrates may be fabricated from a rigid substrate, a hybrid substrate, or a flexible substrate, including a specially designed substrate such as TAB or COB.

MODES FOR CARRYING OUT THE INVENTION

Figure 3:
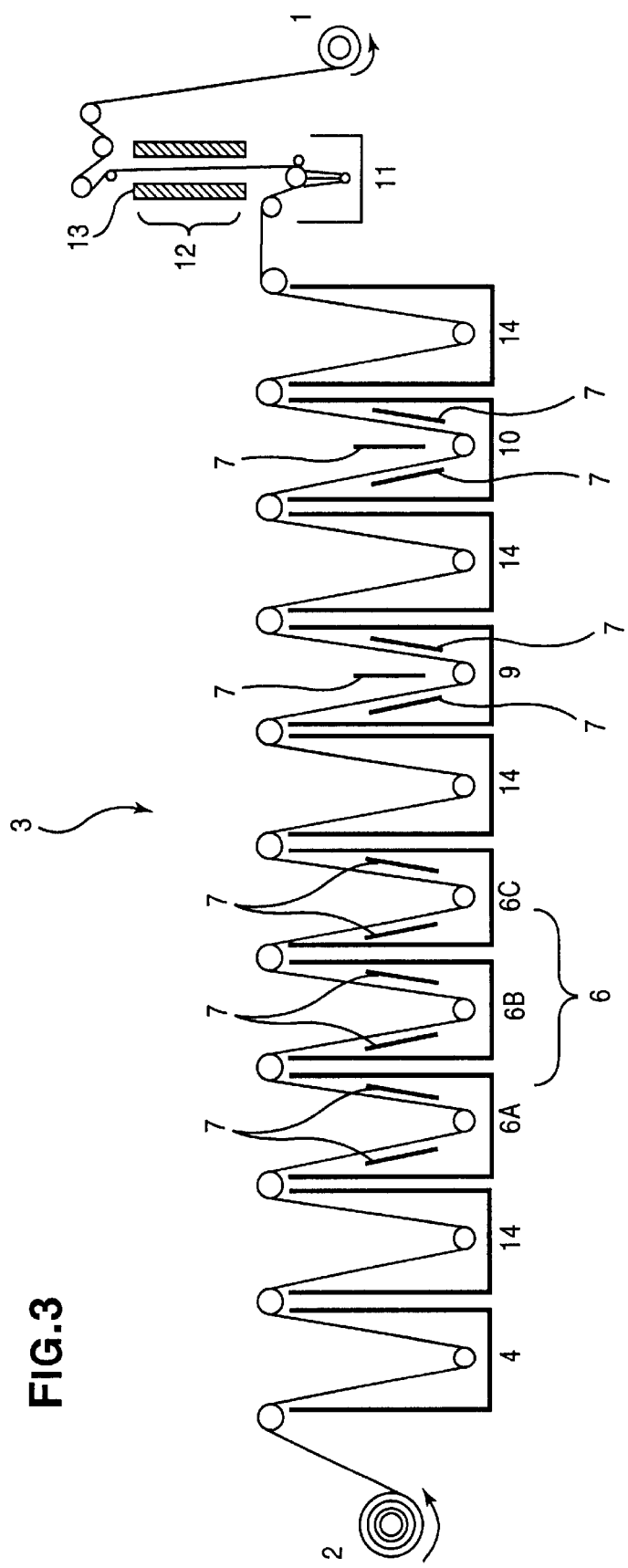

Embodiments of the present invention will next be described with reference to FIGS. 1, 2, and 3. In the following embodiments, methods of producing surface-treated clad laminates produced from the thus-surface-treated copper foil 1 are described, along with results of evaluation. Copper foil 2 employed in the following embodiments is electrolytic copper foil.

EXAMPLE 1

In Example 1, copper foil 2 was surface-treated with a surface-treating apparatus 3. The employed copper foil 2 was coiled before surface treatment. In the apparatus 3 shown in FIG. 2, the copper foil 2 is unwound from a foil roll and travels, in a winding manner, through the surface-treating apparatus 3. Copper foil having a nominal thickness of 35 μm and classified as Grade 3 was employed as the copper foil 2, to thereby produce an electrolytic copper foil employed in printed wiring boards. Hereinafter, production conditions will be described with reference to an apparatus wherein a variety of baths are continuously disposed in-line. The embodiment will be described with reference to FIG. 1(a) showing a cross-sectional view of the surface-treated copper foil.

Firstly, the copper foil 2 taken from the foil roll was transferred into a pickling bath 4 filled with a diluted sulfuric acid solution having a concentration of 150 g/l at 30° C. The foil was immersed for 30 seconds, to remove oily matter and surface oxide film from the surface of the copper foil 2.

After the copper foil 2 had been treated in the pickling bath 4, the foil was transferred into nodular-treatment baths 6 in order to form copper microparticles 5 on the surface of the copper foil 2. The treatment carried out in the nodular-treatment baths 6 involved depositing copper microparticles 5 on one surface of the copper foil 2 (step 6A) and seal plating so as to prevent dropping of the copper microparticles 5 (step 6B). In this case, the copper foil 2 itself was cathodically polarized, and appropriate anodes 7 were disposed for carrying out electrolysis. For example, when copper foil 2 is subjected to nodular treatment so as to form double-side-treated copper foil, an anode 7 was disposed to each side of the copper foil 2.

Step 6A, depositing copper microparticles 5 on the copper foil 2, employed a copper sulfate solution (sulfuric acid concentration of 100 g/l, copper concentration of 18 g/l, temperature 25° C.), and electrolysis was carried out for 10 seconds under conditions for forming burnt deposits at a current density of 10 A/dm$^2$. In this case, as shown in FIG. 2, anode plates 7 were placed such that the anode plates faced, in parallel, the surface of the copper foil 2, onto which copper microparticles 5 are formed.

Step 6B, seal plating so as to prevent dropping of the copper microparticles 5, employed a copper sulfate solution (sulfuric acid concentration of 150 g/l, copper concentration of 65 g/l, temperature 45° C.), and electrolysis was carried out for 20 seconds under level plating conditions and at a current density of 15 A/dm$^2$, to thereby form a seal plating layer 8. In this case, as shown in FIG. 2, anode plates 7 were placed such that the anode plates faced, in parallel, the copper-microparticles (5)-deposited surface of the copper foil 2. The anodes 7 were formed of stainless steel plates.

Anti-corrosion treatment through zinc-copper-nickel ternary alloy plating was carried out in a ternary-alloy-anti-corrosion-treatment bath 9, by use of a zinc-copper-nickel ternary alloy as a corrosion-inhibitor. Anodes 7 as shown in FIG. 2 were employed, and the zinc concentration in the ternary-alloy-anti-corrosion-treatment bath 9 was maintained by employing zinc pyrophosphate, copper pyrophosphate, and nickel pyrophosphate. The electrolysis was carried out in a concentration-controlled pyrophosphate solution comprising zinc (15 g/l), copper (10 g/l), and nickel (3 g/l), at 40° C. for eight seconds and at a current density of 15 A/dm$^2$.

Anti-corrosion treatment through electrolytic chromate treatment was carried out in a chromate treatment-anti-corrosion-treatment bath 10, to thereby electrolytically form a chromate layer on the ternary-alloy-plated anti-corrosion layer formed in the ternary-alloy-anti-corrosion treatment bath 9. The electrolysis was carried out in a solution comprising chromic acid (5.0 g/l), at 35° C. and a pH of 11.5 for five seconds and at a current density of 8 A/dm$^2$. In this case, as shown in FIG. 2, anode plates 7 were placed such that the anode plates faced, in parallel, the surface of the copper foil.

After completion of the anti-corrosion treatment, the copper foil was rinsed with water, and immediately and without drying the surface of the copper foil, adsorption of a silane coupling agent on the anti-corrosion layer of the nodular-treated side was effected in a silane-coupling-agent-treatment bath 11.The employed solution was formed of γ-glycidoxypropyltrimethoxysilane (5 g/l) dissolved in deionized water. The solution was sprayed onto the copper foil surface through showering.

After completion of the silane-coupling-agent treatment, the copper foil 2 was passed through, over 4 seconds, a heated furnace including a drying section 12 where the atmosphere had been adjusted by means of an electric heater 13 so as to attain a foil temperature of 140° C., to thereby accelerate condensation reaction of the silane coupling agent. The thus-dehydrated surface-treated copper foil 1 was then wound into a roll. During the aforementioned steps, the copper foil ran at 2.0 m/minute. A rinsing bath 14 capable of performing about 15 sec. water-rinsing was optionally disposed between successive operation baths, thereby preventing the solution from being carried over from the previous bath.

The thus-formed surface-treated copper foil 1 and two sheets of FR-4 prepreg, serving as substrates and having a thickness of 150 μm, were laminated to thereby produce a double-sided copper-clad laminate. The peel strength at the bond interface between the surface-treated copper foil 1 and the substrate was measured. The measurement was carried out at seven points per specimen, and the results are shown in Table 5.

EXAMPLE 2

In Example 2, copper foil 2 was surface-treated with a surface-treating apparatus 3. The employed copper foil 2 was wound before surface treatment. In the apparatus 3 shown in FIG. 3, copper foil 2 is unwound from a foil roll and travels, in a winding manner, in the surface-treating apparatus 3. Copper foil having a nominal thickness of 35 μm and classified as Grade 3 was employed as the copper foil 2, to thereby produce an electrolytic copper foil employed in printed wiring boards. Hereinafter, production conditions will be described with reference to an apparatus wherein a variety of baths are continuously disposed in-line. In order to avoid redundant description, only portions that differ from corresponding portions described in relation to Example 1 will be described. Portions identical with those of Example 1 are denoted by the same reference numerals in FIG. 3, so far as such is possible. The embodiment will be described with reference to FIG. 1(b) showing a cross-sectional view of the surface-treated copper foil.

The flow of surface treatment carried out in Example 2 is identical with that carried out in Example 1, except that the nodular treatment carried out in baths 6 comprises three steps; i.e., step 6A for.depositing copper microparticles 5; seal plating step 6B; and step 6C for depositing copper ultra-microparticles 15. Briefly, the step 6C for depositing copper ultra-microparticles 15 is disposed between the seal plating step 6B, as carried out in Example 1, and the ternary-alloy-anti-corrosion step carried out in the bath 9.

Step 6C, depositing copper ultra-microparticles 15, employs a copper sulfate solution (copper concentration of 10 g/l, sulfuric acid concentration of 100 g/l, 9-phenylacridine concentration of 140 mg/l, temperature 38° C.), and electrolysis was carried out at a current density of 30 A/dm$^2$. Other conditions of treatment steps carried out in the baths are identical with those employed in Example 1.

The thus-formed surface-treated copper foil 1 and two sheets of FR-4 prepreg, serving as substrates and having a thickness of 150 μm, were laminated to thereby produce a double-sided copper-clad laminate. The peel strength at the bond interface between the surface-treated copper foil 1 and the substrate was measured. The measurement was carried out at seven points per specimen, and the results of Examples 1 and 2 are shown in Table 5.

TABLE 5

| Specimens | | Initial peel strength kg/cm | Peel strength after floating on solder bath kg/cm | Resistance to HCL; loss in peel strength (%) | Moisture resistance; loss in peel strength (%) |
|---|---|---|---|---|---|
| | | Peel test results (0.2 mm-line-width circuit) | | | |
| Example 1 | 1 | 1.87 | 1.86 | 3.6 | 8.5 |
| | 2 | 1.86 | 1.86 | 3.5 | 8.3 |
| | 3 | 1.87 | 1.86 | 4.0 | 8.7 |
| | 4 | 1.88 | 1.87 | 3.8 | 8.1 |
| | 5 | 1.87 | 1.86 | 3.7 | 8.9 |
| | 6 | 1.86 | 1.86 | 3.2 | 9.0 |
| | 7 | 1.87 | 1.87 | 3.5 | 8.4 |
| Example 2 | 1 | 1.88 | 1.87 | 0.2 | 6.7 |
| | 2 | 1.89 | 1.87 | 1.0 | 7.0 |
| | 3 | 1.88 | 1.87 | 0.8 | 7.2 |
| | 4 | 1.87 | 1.86 | 0.0 | 6.3 |
| | 5 | 1.88 | 1.87 | 0.0 | 6.5 |
| | 6 | 1.87 | 1.87 | 0.1 | 7.0 |
| | 7 | 1.88 | 1.86 | 0.6 | 6.1 |

Initial peel strength: A copper-clad laminate was prepared from FR-4, a copper pattern having a line width of 0.2 mm was formed on FR-4. The peel strength between the copper line and the measured.

Peel strength after floating on solder bath: The copper-patterned board was floated on a solder bath (246° C.) for 20 seconds, and then cooled to room temperature. The peel strength was then measured.

Resistance to HCl (loss in peel strength (%)): A copper-clad laminated was prepared from FR-4, and a copper pattern having a line width of 0.2 mm was formed on FR-4. The thus-prepared board was immersed in a solution of hydrochloric acid and water (1:1) for one hour at room temperature, and then removed from the solution, washed, and dried. Immediately after the board was dried, the peel strength was measured. The percent loss in peel strength with respect to the initial peel strength was calculated.

Moisture resistance (loss in peel strength (%)): A copper-clad laminate was prepared from FR-4, and a copper pattern having a line width of 0.2 mm was formed on FR-4. The thus-prepared board was immersed in boiling deonized water (pure water) for two hours, and then pulled from the water and dried. Immediately after the board was dried, the peel strength was measured. The percent loss in peel strength with respect to the initial peel strength was calculated.

As is clear from the results shown in Table 5, copper patterns obtained from the surface-treated copper foil 1 produced in Example 1 or 2 attained a resistance to hydrochloric acid and a moisture resistance (percent loss in peel strength) of 10% or less, even though the line width of the patterns was 0.2 nm. Particularly, the resistance to hydrochloric acid was 5% or less, which is excellent. Interlot variation in resistance to hydrochloric acid and in moisture resistance investigated for at least several tens of lots of copper-laminated products obtained in a manner similar to that of Example 1 or 2 was considerably small. Thus, the copper foil of the present invention has a high and stable quality which has never been attained, as compared with conventional copper foil, and can drastically enhance the quality of printed wiring boards.

Effects of the Invention

By employing the surface-treated copper foil of the present invention, drastically enhanced reliability in adhesion of a copper-foil-derived circuit to a substrate in printed wiring boards during an etching step is obtained; a variety of methods for processing printed wiring boards can be applied; and control of production steps becomes easier. In addition, the method of the present invention for producing the surface-treated copper foil can provide a surface-treated copper foil exhibiting excellent resistance to hydrochloric acid and moisture resistance by bringing out the maximum effect of the silane coupling agent adsorbed onto the copper foil.

What is claimed is:

1. A method of producing a surface-treated copper foil, which method comprising the following steps:
   (a) providing a copper foil;
   (b) forming a nodular-treated surface on the copper foil by depositing copper microparticles on a surface of the copper foil, then seal plating the surface so as to prevent detachment of the deposited copper microparticles and thereafter depositing copper ultra-microparticles on the surface;
   (c) subjecting the nodular-treated surface to an anticorrosion treatment which comprises plating a zinc-copper-nickel ternary alloy layer on the nodular-treated surface and subsequently performing an electrolytic chromate treatment on the surface to obtain an electrolytically chromate-treated surface;
   (d) effecting adsorption of a silane coupling agent on the electrolytically chromate-treated surface without causing the electrolytically chromate-treated surface to attain dryness; and thereafter
   (e) drying the copper foil for 2–6 seconds in a high-temperature atmosphere in which the temperature of the copper foil reaches 105° C.–200° C.

2. The method of producing a surface-treated copper foil as recited in claim 1, wherein the zinc-copper-nickel ternary alloy layer comprises 69.9–20 wt. % zinc, 30–70 wt. % copper, and 0.1–10 wt. % nickel.

3. The method of producing a surface-treated copper foil as recited in claim 2, wherein the silane coupling agent is selected from the group consisting of olefin group-functional silanes, epoxy-group-functional silanes, acrylic-group-functional silanes, amino-group-functional silanes, and mercapto-group-functional silanes.

4. A method of producing a surface-treated copper foil according to claim 3, wherein the copper ultra-microparticles are formed from a copper-component-containing electrolyte to which 9-phenylacridine is added.

5. A method of producing a surface-treated copper foil according to claim 2, wherein the copper ultra-microparticles are formed from a copper-component-containing electrolyte to which 9-phenylacridine is added.

6. The method of producing a surface-treated copper foil as recited in claim 1, wherein the silane coupling agent is selected from the group consisting of olefin group-functional silanes, epoxy-group-functional silanes, acrylic-group-functional silanes, amino-group-functional silanes, and mercapto-group-functional silanes.

7. A method of producing a surface-treated copper foil according to claim 6, wherein the copper ultra-microparticles are formed from a copper-component-containing electrolyte to which 9-phenylacridine is added.

8. A method of producing a surface-treated copper foil according to claim 1, wherein the copper ultra-microparticles are formed from a copper-component-containing electrolyte to which 9-phenylacridine is added.

9. A method of producing a surface-treated copper foil, which method comprising the following steps:
   (a) providing a copper foil;
   (b) forming a nodular-treated surface on the copper foil by depositing copper microparticles on a surface of the copper foil, then seal plating the surface so as to prevent detachment of the deposited copper microparticles and thereafter depositing copper ultra-microparticles on the surface;
   (c) performing zinc-copper-nickel ternary alloy plating on the nodular-treated surface of the copper foil to obtain an alloy plated surface;
   (d) performing an electrolytic chromate treatment on the alloy plated surface to obtain an electrolytically chromate-treated surface;
   (e) effecting adsorption of a silane coupling agent on the electrolytically chromate-treated surface without causing the electrolytically chromate-treated surface to attain dryness; and thereafter
   (f) drying the copper foil for 2–6 seconds in a high-temperature atmosphere in which the temperature of the copper foil reaches 110° C.–200° C.

10. The method of producing a surface-treated copper foil as recited in claim 9, wherein the zinc-copper-nickel ternary alloy comprises 69.9–20 wt. % zinc, 30–70 wt. % copper, and 0.1–10 wt. % nickel.

11. A method of producing a surface-treated copper foil according to claim 10, wherein the copper ultra-microparticles are formed from a copper-component-containing electrolyte to which 9-phenylacridine is added.

12. The method of producing a surface-treated copper foil according to claim 10, wherein the silane coupling agent is selected from the group consisting of olefin group-functional silanes, epoxy-group-functional silanes, acrylic-group-functional silanes, amino-group-functional silanes, and mercapto-group-functional silanes.

13. The method of producing a surface-treated copper foil as recited in claim 9, wherein the silane coupling agent is selected from the group consisting of olefin group-functional silanes, epoxy-group-functional silanes, acrylic-group-functional silanes, amino-group-functional silanes, and mercapto-group-functional silanes.

14. A method of producing a surface-treated copper foil according to claim 13, wherein the copper ultra-microparticles are formed from a copper-component-containing electrolyte to which 9-phenylacridine is added.

15. A method of producing a surface-treated copper foil according to claim 9, wherein the copper ultra-microparticles are formed from a copper-component-containing electrolyte to which 9-phenylacridine is added.

* * * * *